(12) United States Patent
Shimizu et al.

(10) Patent No.: US 8,483,643 B2
(45) Date of Patent: Jul. 9, 2013

(54) HARMONIC REJECTION MIXER

(75) Inventors: Yoshito Shimizu, Osaka (JP); Noriaki Saito, Tokyo (JP); Kiyomichi Araki, Saitama (JP); Takafumi Nasu, Tokushima (JP)

(73) Assignee: Panasonic Corporation, Osaka (JP)

( * ) Notice: Subject to any disclaimer, the term of this patent is extended or adjusted under 35 U.S.C. 154(b) by 174 days.

(21) Appl. No.: 13/143,789

(22) PCT Filed: Jan. 29, 2010

(86) PCT No.: PCT/JP2010/000554
§ 371 (c)(1),
(2), (4) Date: Sep. 20, 2011

(87) PCT Pub. No.: WO2010/087199
PCT Pub. Date: Aug. 5, 2010

(65) Prior Publication Data
US 2012/0049926 A1    Mar. 1, 2012

(30) Foreign Application Priority Data
Jan. 29, 2009  (JP) ................................ 2009-017898

(51) Int. Cl.
*H04B 1/10*  (2006.01)
*H04B 1/26*  (2006.01)
*H02M 11/00*  (2006.01)

(52) U.S. Cl.
USPC ........... 455/302; 455/285; 455/326; 327/103; 327/120; 327/355

(58) Field of Classification Search
USPC ................. 455/255, 285, 296, 302, 313, 323, 455/326, 334; 327/103, 113, 119, 120, 175, 327/355, 361; 375/346
See application file for complete search history.

(56) References Cited

U.S. PATENT DOCUMENTS

| | | | |
|---|---|---|---|
| 3,962,551 A | 6/1976 | Gay | |
| 5,220,607 A | 6/1993 | Rebel | |

(Continued)

FOREIGN PATENT DOCUMENTS

| | | |
|---|---|---|
| JP | 55-95178 | 7/1980 |
| JP | 2004-527130 | 9/2004 |

(Continued)

OTHER PUBLICATIONS

Bagheri, R., et al., "An 800Mhz to 5Ghz Software-Defined Radio Receiver in 90nm CMOS", Papers of the 2006 IEEE International Solid-State Circuits Conference, Feb. 2006, pp. 1-10.

(Continued)

*Primary Examiner* — Quochien B Vuong
(74) *Attorney, Agent, or Firm* — Greenblum & Bernstein, P.L.C.

(57) ABSTRACT

Disclosed is a harmonic rejection mixer that makes it possible to suppress high-frequency response, while keeping the number of gm elements from increasing. In a harmonic rejection mixer that regulates the waveform of an output signal by mixing outputs of multiple mixers that are connected in parallel with the latter stage of multiple gm elements, some of the gm elements are shared by I phase and Q phase by using a control signal with a duty ratio of less than 50% to drive at least some of the mixers, and then using the period in which the I-phase mixers are inactive to activate the Q-phase mixers.

10 Claims, 15 Drawing Sheets

U.S. PATENT DOCUMENTS

| | | | |
|---|---|---|---|
| 7,130,604 B1 * | 10/2006 | Wong et al. | 455/302 |
| 7,509,110 B2 * | 3/2009 | Hayashi et al. | 455/302 |
| 7,519,348 B2 * | 4/2009 | Shah | 455/285 |
| 7,679,543 B2 * | 3/2010 | Park et al. | 327/175 |
| 8,203,375 B2 * | 6/2012 | De Jong et al. | 327/359 |
| 2002/0163828 A1 | 11/2002 | Krieger et al. | |
| 2003/0083852 A1 | 5/2003 | Muhammad et al. | |
| 2006/0040634 A1 | 2/2006 | Wang | |
| 2007/0112904 A1 | 5/2007 | Kasperkovitz | |
| 2010/0052792 A1 | 3/2010 | Nose et al. | |

FOREIGN PATENT DOCUMENTS

| | | |
|---|---|---|
| JP | 2004-289793 | 10/2004 |
| JP | 2005-536099 | 11/2005 |
| JP | 2006-211153 | 8/2006 |
| JP | 2007-535830 | 12/2007 |
| JP | 2008-022522 | 1/2008 |
| WO | 02/091384 | 11/2002 |
| WO | 2008/032782 | 3/2008 |

OTHER PUBLICATIONS

Weldon, J.A., et al., "A 1.75-GHz Highly Integrated Narrow-Band CMOS Transmitter With Harmonic-Rejection Mixers", IEEE Journal of Solid-State Circuits, vol. 36, No. 12, Dec. 2001, pp. 2003-2015.
Petrov, A.R. "System Approach for Low I/F Noise, High IP2 Dynamic Range CMOS Mixer Design", Proceedings of the 15$^{th}$ Biennial University/Government/Industry Microelectronics Symposium, Jun. 30, 2003, pp. 74-77.

* cited by examiner

HARMONIC REJECTION MIXER

TECHNICAL FIELD

The present invention relates to an odd-order harmonic response suppression (harmonic rejection) technology for a mixer used in a high frequency processing section in a radio communication system.

BACKGROUND ART

A TV tuner needs to cover a wide reception band allocated to TV broadcast signals. For example, in Japan, a TV tuner needs to support VHF (Very High Frequency) channels (100 MHz band, 200 MHz band) and UHF (Ultra High Frequency) channels (470 MHz to 770 MHz). Also, a software radio needs to support a plurality of radio systems that use different radio bands.

In general, when a radio frequency signal of a frequency band that is an odd multiple of a local oscillation signal for driving a mixer is input to a mixer configuring a radio reception section, a disturbing signal frequency-converted to a frequency in the vicinity of received signal output having a desired frequency is output due to a nonlinear characteristic of the mixer (this disturbing signal is referred to below as odd-order harmonic response).

Here, if a reception band that should be supported by a TV tuner or software radio is wide, and the ratio between signal amplitude when a signal of a desired frequency is received and signal amplitude of other than a desired frequency component output due to harmonic response reaches a predetermined value, reception sensitivity degrades. Thus, technology is known that suppresses odd-order harmonic response by approximating an output waveform of a high-frequency component in mixer output to a sine wave (see Non-Patent Literature 1, for example).

FIG. 1 is a block diagram showing a conventional harmonic rejection mixer illustrated in FIG. 26.6.3 of Non-Patent Literature 1. As shown in FIG. 1, conventional harmonic rejection mixer 10 is provided with gm elements 1, 2, and 3, and mixers 4, 5, and 6, performs frequency conversion of a signal input from input terminal 11, and outputs the signal from output terminal 12.

These gm elements 1, 2, and 3 convert a voltage input from input terminal 11 to a current. Here, the ratio of an input voltage to output current of gm elements 1, 2, and 3 is set to gm1:gm2:gm3=1:√2:1.

Mixers 4, 5, and 6 are driven using control signals 21, 22, and 23 such as shown in FIG. 2. These control signals 21, 22, and 23 are pulse trains with the same frequency, a ratio of a Hi period (an on-period) to one cycle (hereinafter referred to as a duty ratio) of 50%, and phases shifted successively by 45°.

Thus, a high-frequency component output waveform such as shown in FIG. 3 is obtained by executing amplitude weighting by means of gin elements located in the respective paths after input signal branching, and adding and combining output signals of mixers driven by control signals with phases shifted successively by 45°. Since this output waveform approximates a sine wave, odd-order harmonic response can be suppressed.

In addition to above Non-Patent Literature 1, technology that suppresses harmonic response of a reception mixer used in a radio reception section by approximating an output waveform to a sine wave, and technology that suppresses harmonic distortion generated by a transmission mixer used in an amplifier or radio transmission section, are known (see Patent Literature 1 through Patent Literature 6, and Non-Patent Literature 2).

Here, as an example, a description will be given of harmonic rejection technology in a power amplifier described in Patent Literature 6. FIG. 4 is a configuration diagram of a power amplifier illustrated in FIG. 1A of Patent Literature 6. As shown in FIG. 4, power amplifier 50 is provided with amplifier circuit 51 and amplifier circuit 52, amplifies signals input from input terminal 61, input terminal 62, and input terminal 63, and outputs a signal from output terminal 64.

Amplifier circuit 51 has an inverter configuration comprising PMOS (Positive channel Metal Oxide Semiconductor) and NMOS (Negative channel Metal Oxide Semiconductor), in which a PMOS gate terminal is connected to input terminal 61 and an NMOS gate terminal is connected to input terminal 62, and the PMOS and NMOS are driven by independent input signals (input signal 55 and input signal 56). On the other hand, amplifier circuit 52 has an inverter configuration comprising PMOS and NMOS, in which the PMOS and NMOS gate terminals are connected to input terminal 63, and the PMOS and NMOS are driven by the same input signal (input signal 57).

FIG. 5 shows input signals 55, 56, and 57 input to power amplifier 50. Input signal 57 is a signal with a duty ratio of 50%, and is input to amplifier circuit 52 via input terminal 63. Input signal 55 is a signal that goes low during a Hi period of input signal 57 so that the operating time of the PMOS in amplifier circuit 51 is less than 50% of one cycle, and is input to the PMOS of amplifier circuit 51 via input terminal 61. Input signal 56 is a signal that goes high during a Low period of input signal 57 so that the operating time of the NMOS in amplifier circuit 51 is less than 50% of one cycle, and is input to the NMOS of amplifier circuit 51 via input terminal 62.

Here, by setting the transistor size ratio between amplifier circuit 51 driven by input signals 55 and 56 and amplifier circuit 52 driven by input signal 57 appropriately, the waveform of an output signal output via output terminal 64 (a signal obtained by adding the output signals of amplifier circuit 51 and amplifier circuit 52) can be approximated to a sine wave.

CITATION LIST

Patent Literature

PTL 1

U.S. Pat. No. 3,962,551 specification

PTL 2

U.S. Pat. No. 5,220,607 specification

PTL 3

Japanese Patent Application No. SHO55-095178

PTL 4

Published Japanese Translation No. 2005-536099 of the PCT International Publication

PTL 5

Published Japanese Translation No. 2007-535830 of the PCT International Publication

PTL 6

WO No. 2008/032782 pamphlet

PTL 7

Japanese Patent Application Laid-Open No. 2004-289793

Non-Patent Literature

NPL 1
R. Bagheri, et al, "An 800 MHz to 5 GHz Software-Defined Radio Receiver in 90 nm CMOS", Dig. Tech. Papers of the 2006 IEEE International Solid-State Circuits Conference (ISSCC), February, 2006, pp. 480-481.

NPL 2
Weldon, J. A. et al, "A 1.75 GHz Highly-Integrated Narrow-Band CMOS Transmitter with Harmonic-Rejection Mixers", Section 10.4 of Dig. Tech. Papers of the 2001 IEEE ISSCC, Feb. 5-7, 2001. pp. 160-162.

SUMMARY OF INVENTION

Technical Problem

A conventional harmonic rejection mixer has a configuration whereby harmonic response is suppressed by executing amplitude weighting by means of gm elements located in the respective paths after input signal branching, and adding and combining output signals of mixers driven by control signals with phases shifted successively by 45°. Consequently, a problem with the use of a configuration that suppresses harmonic response has been that the number of gm elements, circuit scale, and consumption current increase.

Also, a problem when configuring an orthogonal demodulator has been that more gm elements are necessary in order to perform I-phase and Q-phase output waveform adjustment, and the circuit scale and consumption current increase.

It is an object of the present invention to provide a harmonic rejection mixer that makes it possible to suppress harmonic response while suppressing an increase in the number of gm elements.

Solution to Problem

A harmonic rejection mixer of the present invention, firstly, is a harmonic rejection mixer that adjusts a waveform of an output signal by combining outputs of a plurality of mixers connected in parallel to a rear stage of a plurality of gm elements, and has, as the plurality of gm elements that convert a voltage signal to a current signal, an I-phase gm element, a Q-phase gm element, and a shared gm element shared by an I phase and Q phase: wherein: each output of the plurality of gm elements branches into a plurality; each of the plurality of mixers has a configuration in which a switching element is connected to a branch of one output among the plurality of gm elements; a switching element connected to a branch of an output of the I-phase gm element and the Q-phase gm element is controlled by a driving signal with a ratio of an on-period to one cycle of 50%; a switching element connected to a branch of an output of the shared gm element is controlled by a driving signal with a ratio of an on-period to one cycle of less than 50%; and a Q-phase output switching element is on in at least part of an off-period of an I-phase output switching element among a plurality of switching elements connected to a shared gm element.

By means of this configuration, it is possible for a gm element to which a control switching element is connected by a driving signal with a ratio of an on-period to one cycle of less than 50% to be shared by an I phase and Q phase, and a harmonic rejection mixer can be configured while suppressing an increase in the number of gm elements.

A harmonic rejection mixer of the present invention, secondly, has a configuration, in addition to the first configuration, whereby, in any of the plurality of gm elements, the switching elements connected to each branch of an output of the same gm element are controlled by driving signals comprising pulse trains that prevent entry into an on state simultaneously.

By means of this configuration, a harmonic rejection mixer can be configured while suppressing an increase in the number of gm elements, and a harmonic response suppression effect can be improved.

A harmonic rejection mixer of the present invention, thirdly, has a configuration, in addition to the first configuration or second configuration, whereby a switching element connected to a branch of an output of the shared gm element is controlled by a driving signal with a ratio of an on-period to one cycle of 25%.

By means of this configuration, a harmonic rejection mixer can be configured while suppressing an increase in the number of gm elements, and a harmonic response suppression effect can be improved.

A harmonic rejection mixer of the present invention, fourthly, is a harmonic rejection mixer that adjusts a waveform of an output signal by combining outputs of a plurality of mixers connected in parallel to a rear stage of a plurality of gm elements, and has, as the plurality of gm elements that convert a voltage signal to a current signal, an I-phase gm element, a Q-phase gm element, and a shared gm element shared by an I phase and Q phase; wherein: each output of the plurality of gm elements branches into a plurality; each of the plurality of mixers has a configuration in which a switching element is connected to a branch of one output among the plurality of gm elements; a switching element connected to a branch of each output of the I-phase gm element, the Q-phase gm element, and the shared gm element is controlled by a driving signal with a ratio of an on-period to one cycle that is a common value of less than 50%; and a Q-phase output switching element is on in at least part of an off-period of an I-phase output switching element among a plurality of switching elements connected to a shared gm element.

By means of this configuration, it is possible for a gm element to which a control switching element is connected by a driving signal with a ratio of an on-period to one cycle of less than 50% to be shared by an I phase and Q phase, and a harmonic rejection mixer can be configured while suppressing an increase in the number of gm elements.

A harmonic rejection mixer of the present invention, fifthly, has a configuration further having, in addition to the fourth configuration, a plurality of capacitors connected to a rear stage of the plurality of mixers; wherein in any of the plurality of gm elements, of the switching elements connected to each branch of an output of the same gm element, switching elements connected to different capacitors are controlled by driving signals comprising pulse trains that prevent entry into an on state simultaneously.

By means of this configuration, a harmonic rejection mixer can be configured while suppressing an increase in the number of gm elements, and a harmonic response suppression effect can be improved.

A harmonic rejection mixer of the present invention, sixthly, has a configuration, in addition to the fourth configuration or fifth configuration, whereby a switching element connected to a branch of each output of the I-phase gm element, the Q-phase gm element, and the shared gm element is controlled by a driving signal with a ratio of an on-period to one cycle of 25%.

By means of this configuration, a harmonic rejection mixer can be configured while suppressing an increase in the number of gm elements, and a harmonic response suppression effect can be improved.

A harmonic rejection mixer of the present invention, seventhly, has a configuration, in addition to any one of the first through sixth configurations, whereby a driving signal group that controls the switching elements comprises pulse trains of the same frequency having mutually different phases.

By means of this configuration, a harmonic rejection mixer can be configured while suppressing an increase in the number of gm elements, and a harmonic response suppression effect can be improved.

A harmonic rejection mixer of the present invention, eighthly, has a configuration, in addition to any one of the first through seventh configurations, whereby the plurality of gm elements perform amplitude weighting on an input signal.

By means of this configuration, a harmonic rejection mixer can be configured while suppressing an increase in the number of gm elements, and a harmonic response suppression effect can be improved.

DESCRIPTION OF EMBODIMENTS

Now, embodiments of the present invention will be described in detail with reference to the accompanying drawings.

Embodiment 1

In this embodiment, a configuration is described whereby the number of gm elements used in a harmonic rejection mixer is reduced by using a control signal with a duty ratio (ratio of an on-period to one cycle) other than 50%, and more particularly, less than 50%.

Figure 1:
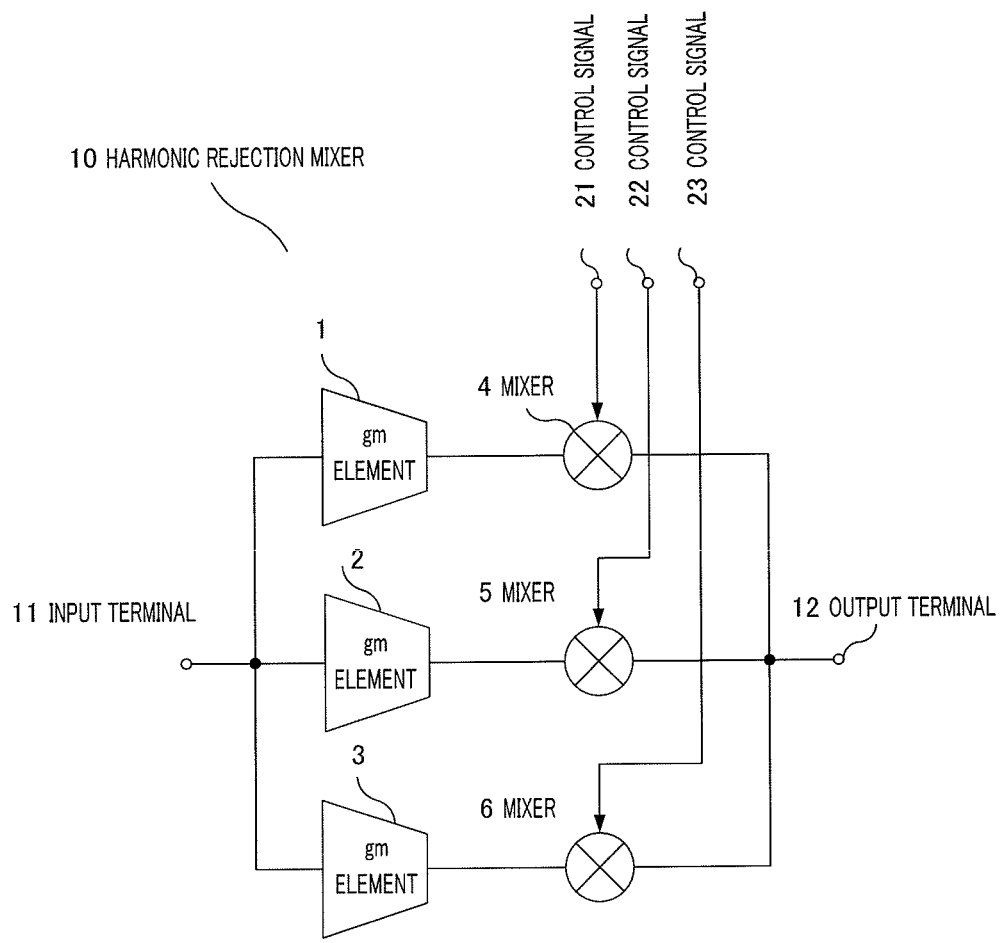
FIG. 1 is drawing showing a configuration of a harmonic rejection mixer according to Non-Patent Literature 1.
Figure 2:
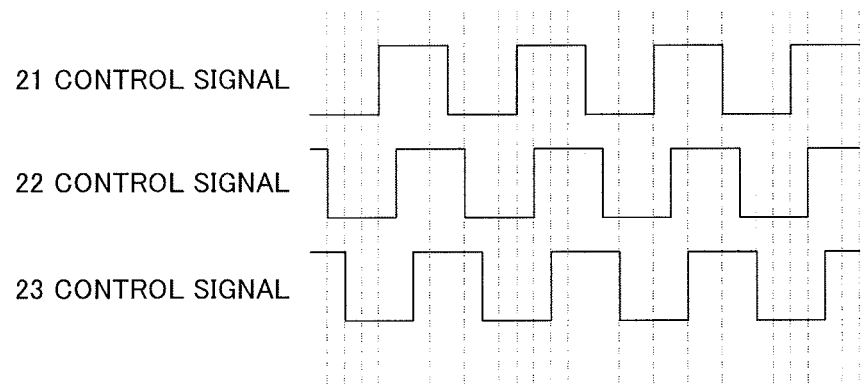
FIG. 2 shows control signal waveforms according to Non-Patent Literature 1.
Figure 3:
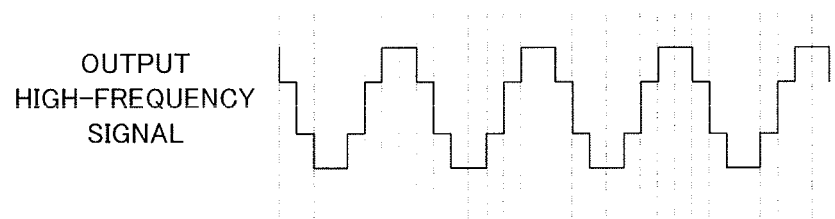
FIG. 3 shows an output signal waveform according to Non-Patent Literature 1.
Figure 4:
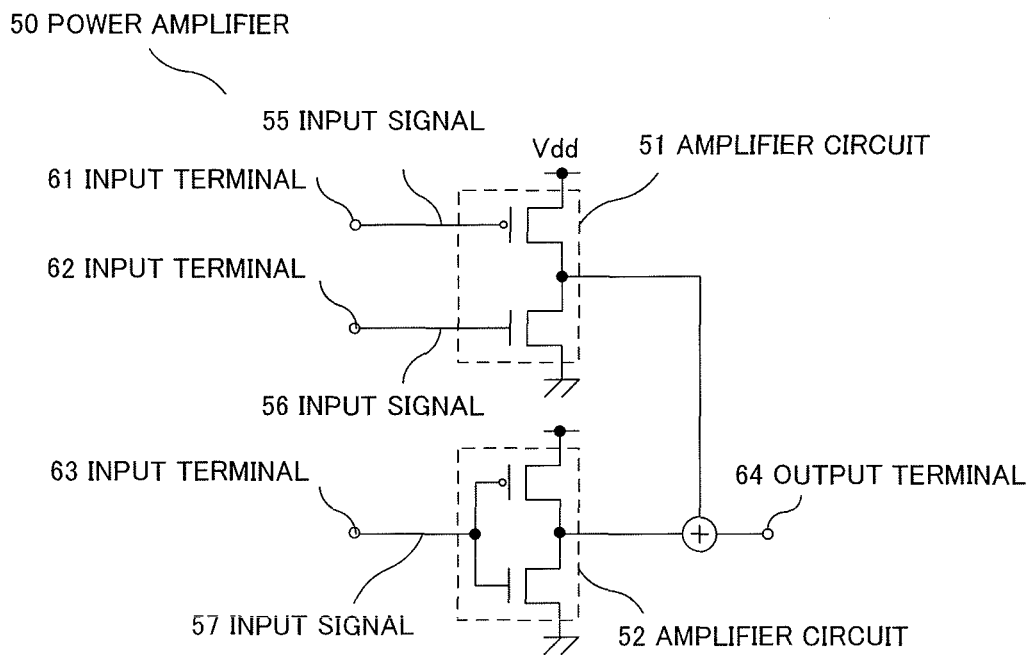
FIG. 4 shows a configuration of a power amplifier according to Patent Literature 6.
Figure 5:
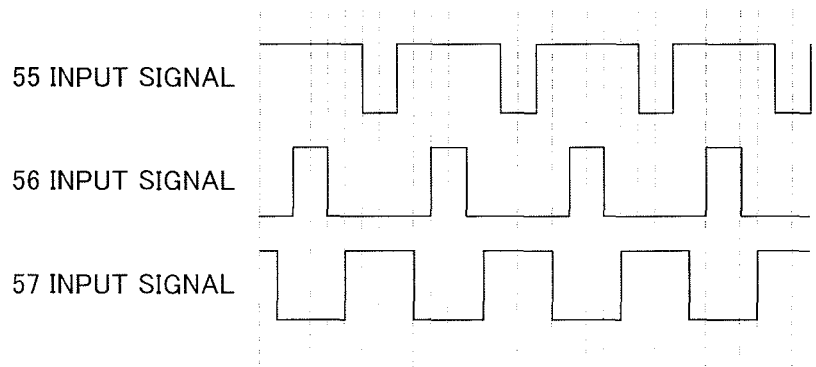
FIG. 5 shows input signal waveforms of a power amplifier according to Patent Literature 6.
Figure 6:
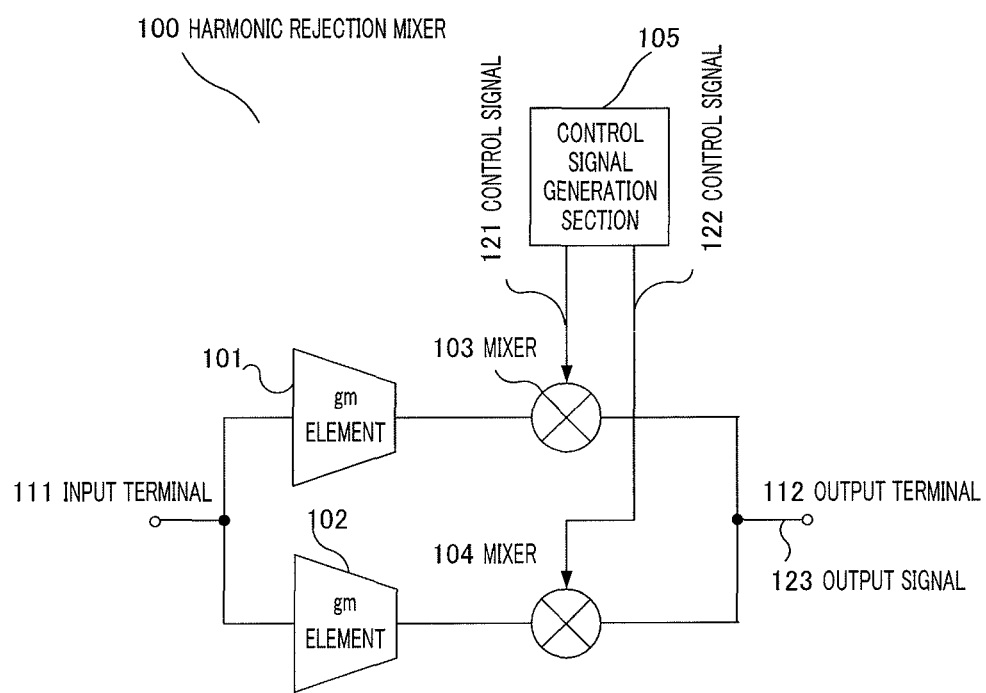
FIG. 6 shows an example of a harmonic rejection mixer according to Embodiment 1.

FIG. 6 is a block diagram showing the general configuration of a harmonic rejection mixer according to Embodiment 1 of the present invention. As shown in FIG. 6, harmonic rejection mixer 100 is provided with gm element 101, gm element 102, mixer 103, mixer 104, and control signal generation section 105, performs frequency conversion of a signal input from input terminal 111, and outputs output signal 123 from output terminal 112.

Above gm element 101 and gm element 102 convert an alternating voltage input from input terminal 111 to an alternating current. Here, the ratios of an input voltage to output current of gm element 101 and gm element 102 are designated gm101 and gm102, and are set to gm101:gm102=1:$\sqrt{2}$.

Mixer 103 is connected to gm element 101, and is driven by control signal 121 output from control signal generation section 105. Mixer 104 is connected to gm element 102, and is driven by control signal 122 output from control signal generation section 105.

Figure 7A:
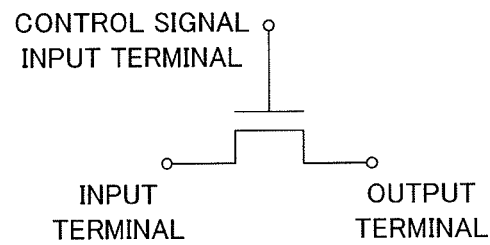
FIG. 7 shows examples of mixer configurations according to Embodiment 1 through Embodiment 4.
Figure 7B:
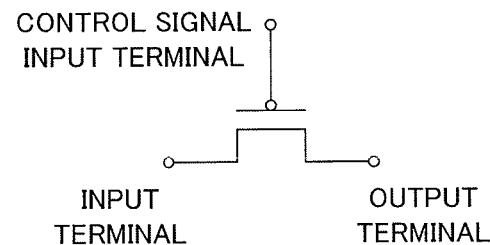
Figure 7C:
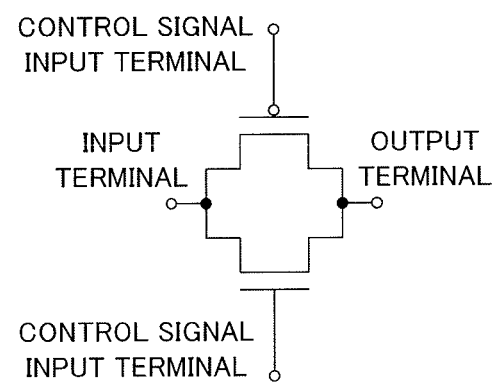

Here, mixer 103 and mixer 104 are preferably passive mixers comprising the NMOS switch shown in FIG. 7A, the PMOS switch shown in FIG. 7B, or the CMOS (Complementary Metal Oxide Semiconductor) switch using PMOS and NMOS in a complementary fashion shown in FIG. 7C, are driven by a control voltage, and output an alternating current output from gm element 101 or gm element 102 to output terminal 112 only while in an active state.

Figure 8:
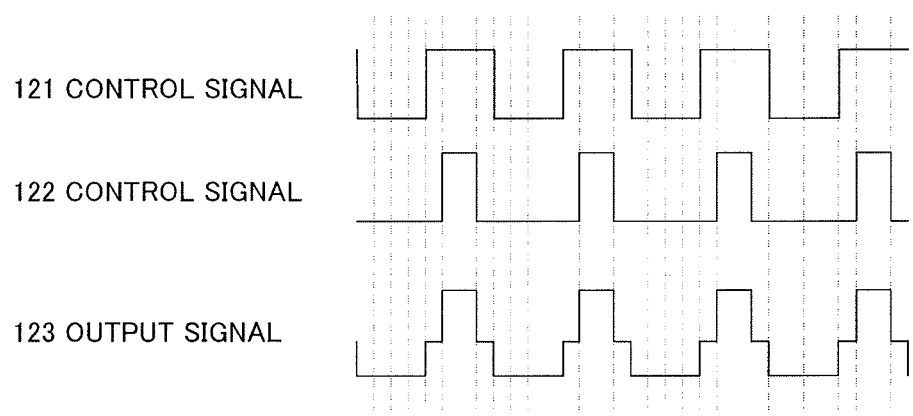
FIG. 8 shows control signal waveforms according to Embodiment 1.

FIG. 8 shows time waveforms of control signal 121, control signal 122, and output signal 123. Control signal 121 is a rectangular wave with a duty ratio of 50%. Control signal 122 is a rectangular wave with a duty ratio of 25%, and preferably has the same frequency as control signal 121, and a phase difference of 45 degrees. Output signal 123 is the result of adding the output signals of mixer 103 and mixer 104.

The operation of harmonic rejection mixer 100 shown in FIG. 6 will now be described. An alternating voltage signal input from input terminal 111 is branched and input to gm element 101 and gm element 102. Here, gm element 101 outputs an alternating current in accordance with gm101 to mixer 103. Mixer 103 is driven by control signal 121, performs frequency conversion processing on an alternating current output from gm element 101 based on the frequency of control signal 121, and outputs a frequency-converted alternating current only while activated by control signal 121. Similarly, gm element 102 outputs an alternating current in accordance with gm102 to mixer 104. Mixer 104 is driven by control signal 122, performs frequency conversion processing on an alternating current output from gm element 102 based on the frequency of control signal 122, and outputs a frequency-converted alternating current only while activated by control signal 122.

A current resulting from adding the output currents of mixer 103 and mixer 104 flows to output terminal 112, and by connecting an appropriate load, the stepped voltage waveform shown in output signal 123 can be extracted, and an output waveform approximating a waveform repeating at a half cycle of a sine wave can be output. A capacitative element such as a capacitor, for example, can be used as a load connected to output terminal 112. When a capacitative element is used, a filter characteristic in accordance with the time of injection of a current into the capacitative element can be added.

A configuration that obtains an output waveform approximating a waveform repeating at one cycle of a sine wave will now be described using FIG. 9 and FIG. 10.

Figure 9:
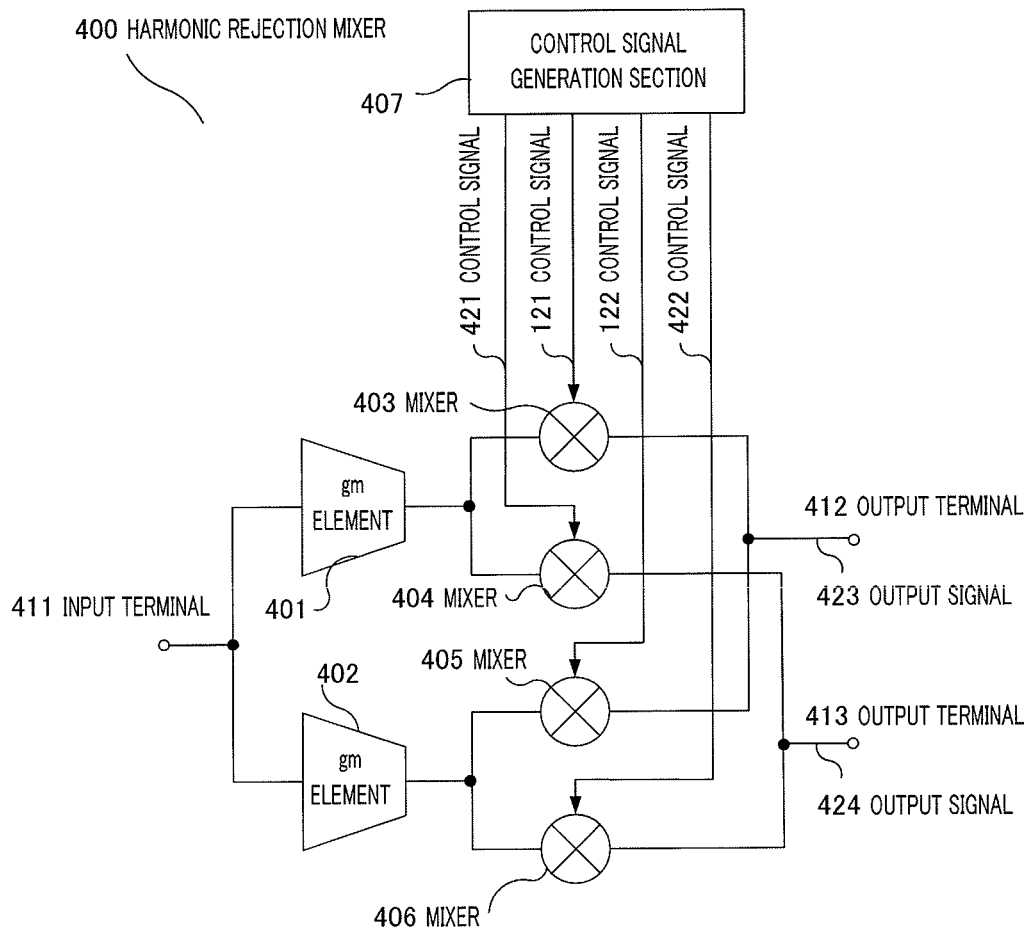
FIG. 9 shows another example of a harmonic rejection mixer according to Embodiment 1.

FIG. 9 is a block diagram showing another example of the general configuration of a harmonic rejection mixer according to this embodiment. As shown in FIG. 9, harmonic rejection mixer 400 is provided with gm element 401, gm element 402, mixer 403, mixer 404, mixer 405, mixer 406, and control signal generation section 407, performs frequency conversion of a signal input from input terminal 411, and outputs output signal 423 and output signal 424 from output terminal 412 and output terminal 413.

Above gm element 401 and gm element 402 convert an alternating voltage input from input terminal 411 to an alternating current. Here, the ratios of an input voltage to output current of gm element 401 and gm element 402 are designated gm401 and gm402, and are set to gm401:gm402=1:√2.

Mixer 403 is connected to gm element 401, and is driven by control signal 121 output from control signal generation section 407. Mixer 404 is connected to gm element 401, and is driven by control signal 421 output from control signal generation section 407. Mixer 405 is connected to gm element 402, and is driven by control signal 122 output from control signal generation section 407. Mixer 406 is connected to gm element 402, and is driven by control signal 422 output from control signal generation section 407.

Here, mixer 403, mixer 404, mixer 405, and mixer 406 are preferably passive mixers comprising the NMOS switch shown in FIG. 7A, the PMOS switch shown in FIG. 7B, or the CMOS switch using PMOS and NMOS in a complementary fashion shown in FIG. 7C. Each of the mixers is driven by a control signal, and outputs an alternating current output from gm element 401 or gm element 402 to output terminal 412 or output terminal 413 only while in an active state (in an on-period).

Figure 10:
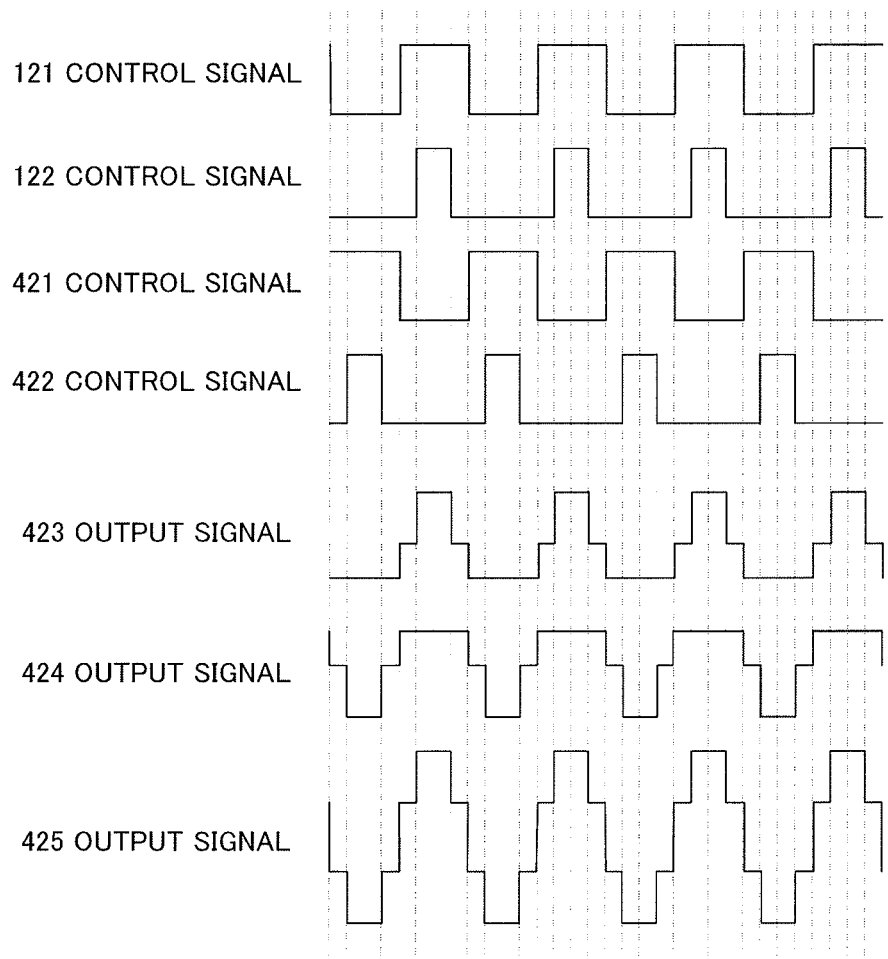
FIG. 10 shows control signal waveforms according to Embodiment 1.

FIG. 10 shows time waveforms of control signal 121, control signal 122, control signal 421, control signal 422, output signal 423, and output signal 424. Control signal 121 and control signal 122 are rectangular waves identical to those described using FIG. 8, and descriptions thereof are omitted here. As shown in FIG. 10, control signal 421 is a rectangular wave with a duty ratio of 50%. Also, control signal 422 is a rectangular wave with a duty ratio of 25%, and preferably has the same frequency as control signal 421, and a phase difference of 45 degrees.

Output signal 423 is the result of adding the output signals of mixer 403 and mixer 405, and has the same waveform as output signal 123 shown in FIG. 8. Output signal 424 is the result of adding the output signals of mixer 404 and mixer 406. Control signal 121 and control signal 421, control signal 122 and control signal 422, and output signal 423 and output signal 424, have the same frequency respectively, with a phase difference of 180 degrees between the signals.

The operation of harmonic rejection mixer 400 shown in FIG. 9 will now be described. An alternating voltage signal input from input terminal 411 is branched and input to gm element 401 and gm element 402.

Here, gm element 401 outputs an alternating current in accordance with gm401 to mixer 403 and mixer 404. Mixer 403 is driven by control signal 121, performs frequency conversion processing on an alternating current output from gm element 401 based on the frequency of control signal 121, and outputs a frequency-converted alternating current only while activated by control signal 121. Mixer 404 is driven by control signal 421, performs frequency conversion processing on an alternating current output from gm element 401 based on the frequency of control signal 421, and outputs a frequency-converted alternating current only while activated by control signal 421.

Similarly, gm element 402 outputs an alternating current in accordance with gm402 to mixer 405 and mixer 406. Mixer 405 is driven by control signal 122, performs frequency conversion processing on an alternating current output from gm element 402 based on the frequency of control signal 122, and outputs a frequency-converted alternating current only while activated by control signal 122. Mixer 406 is driven by control signal 422, performs frequency conversion processing on an alternating current output from gm element 402 based on the frequency of control signal 422, and outputs a frequency-converted alternating current only while activated by control signal 422.

A current resulting from adding the output currents of mixer 403 and mixer 405 flows to output terminal 412, and by connecting an appropriate load, the stepped voltage waveform shown in output signal 423 can be extracted, and an output waveform approximating a waveform repeating at a half cycle of a sine wave can be output.

Also, a current resulting from adding the output currents of mixer 404 and mixer 406 flows to output terminal 413, and by connecting an appropriate load, the stepped voltage waveform shown in output signal 424 can be extracted, and an output waveform approximating a waveform repeating at a half cycle of a sine wave can be output. A capacitative element such as a capacitor, for example, can be used as a load connected to output terminal 412 and output terminal 413.

Here, since output signal 423 and output signal 424 have the same frequency and a phase difference between the signals of 180 degrees, stepped output signal 425 approximating a waveform repeating at one cycle of a sine wave, such as shown at the bottom of FIG. 10, can be obtained by taking the difference between output signals 423 and 424 using a differential amplifier or the like (not shown) in a subsequent stage after the load. In this way, harmonic response can be suppressed.

Here, whereas a harmonic rejection mixer described in Non-Patent Literature 1 requires three gm elements, a harmonic rejection mixer described in Embodiment 1 of the present invention is configured with only two gm elements, enabling the object of reducing the number of gm elements to be achieved.

In this embodiment, a configuration has been described whereby the number of gm elements used in a harmonic rejection mixer is reduced by combining a control signal with a duty ratio of 50% and a control signal with a duty ratio of 25%, but this is not a limitation. If the duty ratio of a control signal with a duty ratio of less than 50% is designated N %, the number of gm elements used in a harmonic rejection mixer can be reduced by making a reference phase difference between a control signal with a duty ratio of 50% and a control signal with a duty ratio of N % (180×N/100) degrees, and setting the ratio between the gm of a gm element of a preceding stage of a mixer driven at a duty ratio of 50% and the gm of a gm element of a rear stage of a mixer driven at a duty ratio of N % so that a sine wave can be simulated by a rectangular wave.

Embodiment 2

In this embodiment, an example of a case is described in which an input signal to a gm element is made a differential signal for a harmonic rejection mixer described in Embodiment 1.

Figure 11:
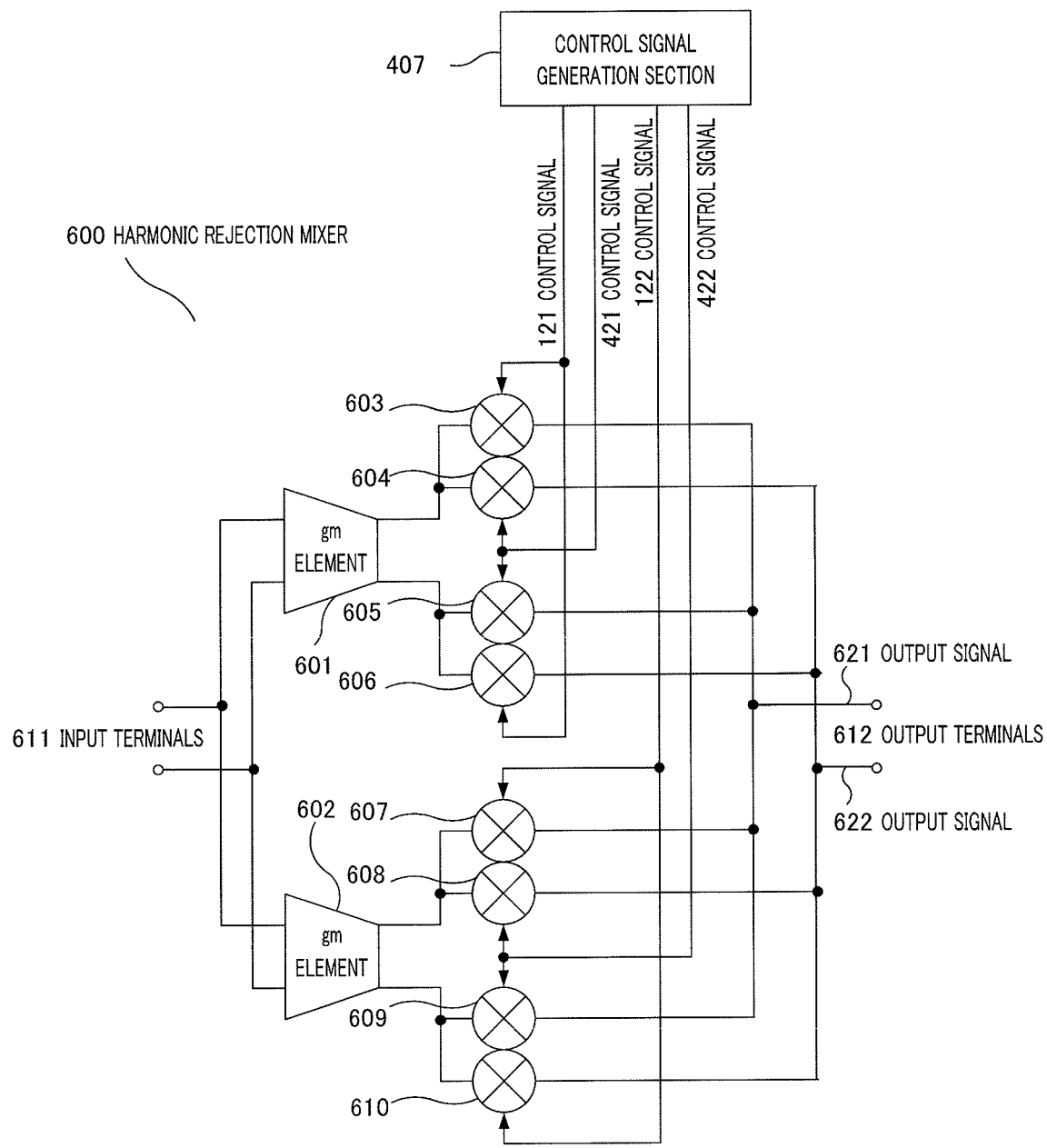
FIG. 11 shows an example of a harmonic rejection mixer according to Embodiment 2.

FIG. 11 is a block diagram showing the general configuration of a harmonic rejection mixer according to Embodiment 2 of the present invention. As shown in FIG. 11, harmonic rejection mixer 600 is provided with gm element 601, gm element 602, mixer 603, mixer 604, mixer 605, mixer 606, mixer 607, mixer 608, mixer 609, mixer 610, and control signal generation section 407, performs frequency conversion of a differential signal input from input terminals 611, and outputs output signal 621 and output signal 622 having a 180-degree phase difference from output terminals 612.

Here, gm element 601 and gm element 602 convert a differential alternating voltage input from input terminals 611 to a differential alternating current. Specifically, gm element 601 and gm element 602 output differential alternating currents with a phase difference corresponding to a positive phase and negative phase of an input differential alternating voltage.

Here, the ratios of an input voltage to output current of gm element 601 and gm element 602 are designated gm601 and gm602, and are set to gm601:gm602=1:$\sqrt{2}$.

Mixer 603 is connected to a positive-phase output section of gm element 601, and is driven by control signal 121 output from control signal generation section 407. Mixer 604 is connected to a positive-phase output section of gm element 601, and is driven by control signal 421 output from control signal generation section 407. Mixer 605 is connected to a negative-phase output section of gm element 601, and is driven by control signal 421 output from control signal generation section 407. Mixer 606 is connected to a negative-phase output section of gm element 601, and is driven by control signal 121 output from control signal generation section 407. Mixer 607 is connected to a positive-phase output section of gm element 602, and is driven by control signal 122 output from control signal generation section 407. Mixer 608 is connected to a positive-phase output section of gm element 602, and is driven by control signal 422 output from control signal generation section 407. Mixer 609 is connected to a negative-phase output section of gm element 602, and is driven by control signal 422 output from control signal generation section 407. Mixer 610 is connected to a negative-phase output section of gm element 602, and is driven by control signal 122 output from control signal generation section 407.

Here, mixer 603, mixer 604, mixer 605, mixer 606, mixer 607, mixer 608, mixer 609, mixer 610 are preferably passive mixers comprising the NMOS switch shown in FIG. 7A, the PMOS switch shown in FIG. 7B, or the CMOS switch using PMOS and NMOS in a complementary fashion shown in FIG. 7C. The mixers are driven by a control signal, and output an alternating current output from a gm element 601 positive-phase output section or negative-phase output section, or gm element 602 positive-phase output section or negative-phase output section, to output terminals 612 only while in an active state (during an on-period).

Figure 12:
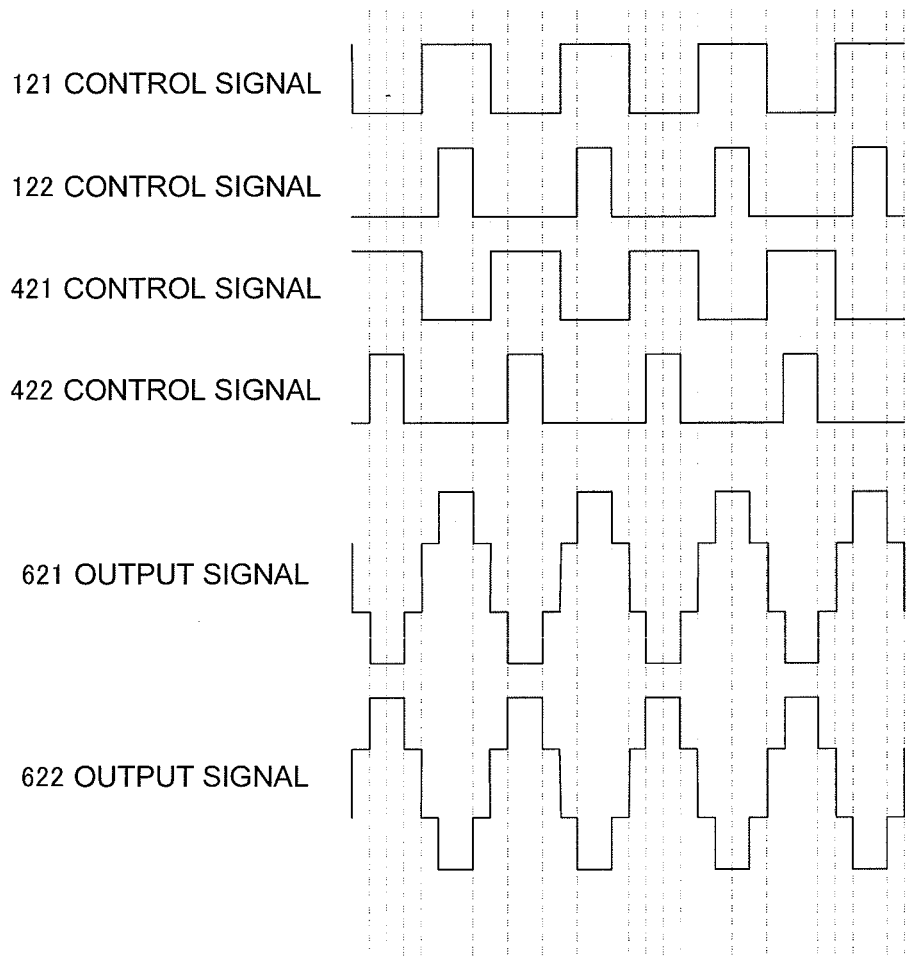
FIG. 12 shows control signal waveforms according to Embodiment 2.

FIG. 12 shows time waveforms of control signal 121, control signal 122, control signal 421, control signal 422, output signal 621, and output signal 622. Control signal 121, control signal 122, control signal 421, and control signal 422 are waveforms identical to those described using FIG. 8 and FIG. 10, and descriptions thereof are omitted here. Output signal 621 is the result of adding the output signals of mixer 603, mixer 605, mixer 607, and mixer 609. Output signal 622 is the result of adding the output signals of mixer 604, mixer 606, mixer 608, and mixer 610. Here, output signal 621 and output signal 622 have the same frequency, and a phase difference between the signals of 180 degrees.

The operation of harmonic rejection mixer 600 shown in FIG. 11 will now be described.

A differential alternating voltage signal input from input terminals 611 is branched and input to gm element 601 and gm element 602. Here, gm element 601 outputs a positive-phase alternating current in accordance with gm601 to mixer 603 and mixer 604, and outputs a negative-phase alternating current in accordance with gm601 to mixer 605 and mixer 606.

Mixer 603 is driven by control signal 121, performs frequency conversion processing on a positive-phase alternating current output from gm element 601 based on the frequency of control signal 121, and outputs a frequency-converted alternating current only while activated by control signal 121. Mixer 604 is driven by control signal 421, performs frequency conversion processing on a positive-phase alternating current output from gm element 601 based on the frequency of control signal 421, and outputs a frequency-converted alternating current only while activated by control signal 421. Mixer 605 is driven by control signal 421, performs frequency conversion processing on a negative-phase alternating current output from gm element 601 based on the frequency of control signal 421, and outputs a frequency-converted alternating current only while activated by control signal 421. Mixer 606 is driven by control signal 121, performs frequency conversion processing on a negative-phase alternating current output from gm element 601 based on the frequency of control signal 121, and outputs a frequency-converted alternating current only while activated by control signal 121.

Also, gm element 602 outputs a positive-phase alternating current in accordance with gm602 to mixer 607 and mixer 608, and outputs a negative-phase alternating current in accordance with gm602 to mixer 609 and mixer 610.

Mixer 607 is driven by control signal 122, performs frequency conversion processing on a positive-phase alternating current output from gm element 602 based on the frequency of control signal 122, and outputs a frequency-converted alternating current only while activated by control signal 122. Mixer 608 is driven by control signal 422, performs frequency conversion processing on a positive-phase alternating current output from gm element 602 based on the frequency of control signal 422, and outputs a frequency-converted alternating current only while activated by control signal 422. Mixer 609 is driven by control signal 422, performs frequency conversion processing on a negative-phase alternating current output from gm element 602 based on the frequency of control signal 422, and outputs a frequency-converted alternating current only while activated by control signal 422. Mixer 610 is driven by control signal 122, performs frequency conversion processing on a negative-phase alternating current output from gm element 602 based on the frequency of control signal 122, and outputs a frequency-converted alternating current only while activated by control signal 122.

A positive-phase current resulting from adding the output currents of mixer 603, mixer 605, mixer 607, and mixer 607, and a negative-phase current resulting from adding the output currents of mixer 604, mixer 606, mixer 608, and mixer 610, are output to output terminals 612. By connecting an appropriate load to each of output terminals 612, the stepped voltage waveforms shown in output signal 621 and output signal 622 can be extracted, and an output waveform approximating a waveform repeating at one cycle of a sine wave can be output. In this way, harmonic response can be suppressed.

A capacitive element such as a capacitor, for example, can be used as a load connected to output terminals 612.

In this embodiment, a configuration has been shown in which wiring is simply branched as a method of branching control signal 121, control signal 122, control signal 421, and control signal 422, but a configuration may also be used in which a buffer is provided in a stage after branching.

With regard to the harmonic rejection mixers shown in Embodiment 1 or Embodiment 2, harmonic rejection mixer 100 is a single-end mixer, harmonic rejection mixer 400 is a single-balance mixer, and harmonic rejection mixer 600 is a double-balance mixer. Therefore, modification into another configuration is possible by developing any one of the configurations based on Embodiment 1 and Embodiment 2. Thus, in the following embodiments, only a single-balance configuration is described in order to simplify the description.

In this embodiment, a configuration has been described whereby the number of gm elements used in a harmonic rejection mixer is reduced by combining a control signal with a duty ratio of 50% and a control signal with a duty ratio of 25%, but this is not a limitation. If the duty ratio of a control signal with a duty ratio of less than 50% is designated N %, the number of gm elements used in a harmonic rejection mixer can be reduced by making a reference phase difference between a control signal with a duty ratio of 50% and a control signal with a duty ratio of N % (180×N/100) degrees, and setting the ratio between the gm of a gm element of a preceding stage of a mixer driven at a duty ratio of 50% and the gm of a gm element of a rear stage of a mixer driven at a duty ratio of N % so that a sine wave can be simulated by a rectangular wave.

Embodiment 3

In this embodiment, an orthogonal demodulator that generates I-phase output and Q-phase output with a 90-degree phase difference is configured using harmonic rejection mixer 400 shown in Embodiment 1 (FIG. 9). A configuration is described in which some of the mixers are driven using a control signal with a duty ratio of less than 50%, and gm elements are shared by an I phase and Q phase by utilizing a period in which a mixer is inactive (off-period).

Figure 13:
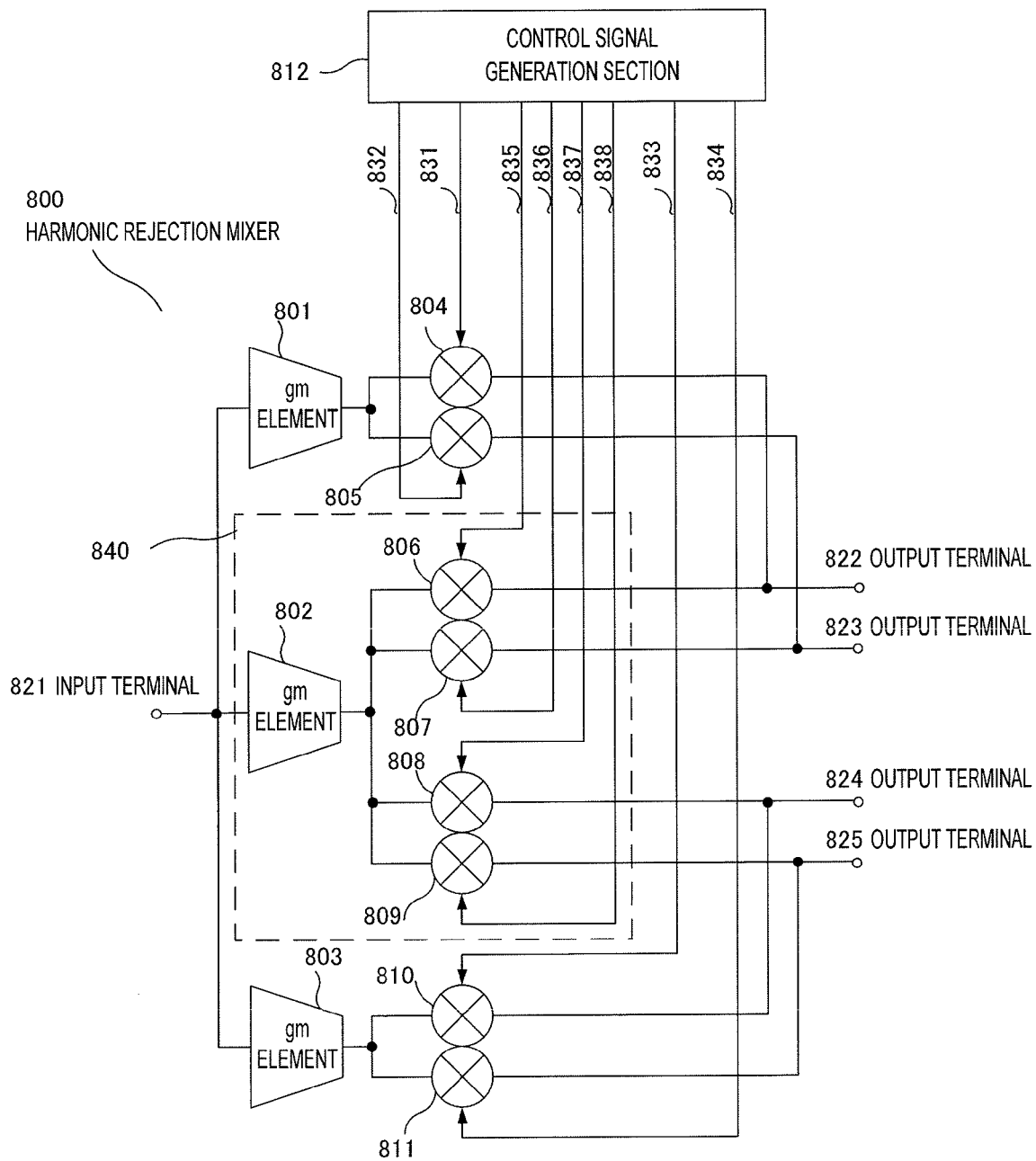
FIG. 13 shows an example of a harmonic rejection mixer according to Embodiment 3.

FIG. 13 is a block diagram showing the general configuration of a harmonic rejection mixer according to Embodiment 3 of the present invention. As shown in FIG. 13, harmonic rejection mixer 800 is provided with I-phase gm element 801, shared gm element 802, Q-phase gm element 803, mixer 804, mixer 805, mixer 806, mixer 807, mixer 808, mixer 809, mixer 810, mixer 811, and control signal generation section 812, performs frequency conversion of a signal input from input terminal 821, and outputs an I-phase positive-phase signal from output terminal 822, an I-phase negative-phase signal from output terminal 823, a Q-phase positive-phase signal from output terminal 824, and a Q-phase negative-phase signal from output terminal 825. Also, gm common block 840 comprises gm element 802, mixer 806, mixer 807, mixer 808, and mixer 809.

Above gm element 801, gm element 802, and gm element 803 convert an alternating voltage input from input terminal 821 to an alternating current. Here, the ratios of an input voltage to output current of gm element 801, gm element 802, and gm element 803 are designated gm 801, gm 802, and gm 803, and are set to gm 801:gm 802:gm 803=1:√2:1.

Mixer 804 is connected to gm element 801, and is driven by control signal 831 output from control signal generation section 812. Mixer 805 is connected to gm element 801, and is driven by control signal 832 output from control signal generation section 812. Mixer 806 is connected to gm element 802, and is driven by control signal 835 output from control signal generation section 812. Mixer 807 is connected to gm element 802, and is driven by control signal 836 output from control signal generation section 812. Mixer 808 is connected to gm element 802, and is driven by control signal 837 output from control signal generation section 812. Mixer 809 is connected to gm element 802, and is driven by control signal 838 output from control signal generation section 812. Mixer 810 is connected to gm element 803, and is driven by control signal 833 output from control signal generation section 812. Mixer 811 is connected to gm element 803, and is driven by control signal 834 output from control signal generation section 812.

Here, mixer 804, mixer 805, mixer 806, mixer 807, mixer 808, mixer 809, mixer 810, and mixer 811 are preferably passive mixers comprising the NMOS switch shown in FIG. 7A, the PMOS switch shown in FIG. 7B, or the CMOS switch using PMOS and NMOS in a complementary fashion shown in FIG. 7C. The mixers are driven by a control signal, and output an alternating current output from gm element 801, gm element 802, or gm element 803 to output terminal 822, output terminal 823, output terminal 824, or output terminal 825 only while in an active state (during an on-period).

Figure 14:
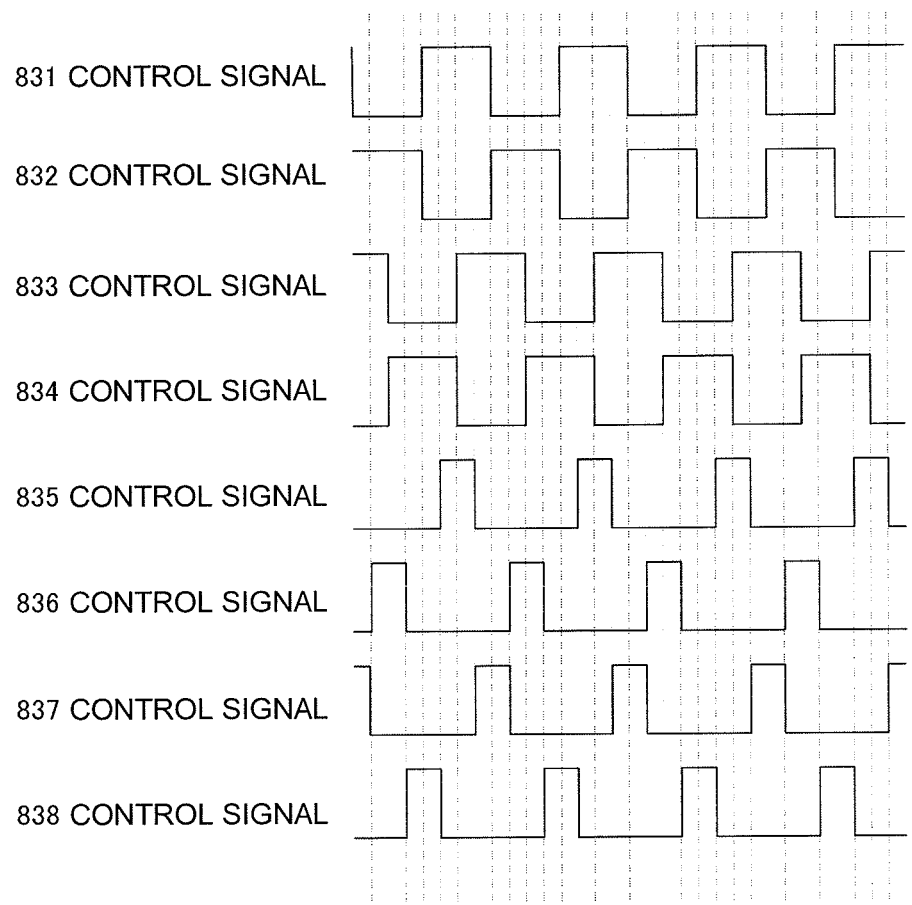
FIG. 14 shows control signal waveforms according to Embodiment 3.

FIG. 14 shows time waveforms of control signals 831, 832, 833, 834, 835, 836, 837, and 838. These control signals have the same frequency but different phases and duty ratios.

Control signal 831, control signal 832, control signal 833, and control signal 834 are rectangular waves with a duty ratio of 50%. The phase difference between control signal 831 and control signal 832, and the phase difference between control signal 833 and control signal 834, is 180 degrees. Also, the phase difference between control signal 831 and control signal 833, and the phase difference between control signal 832 and control signal 834, is 90 degrees.

On the other hand, control signals 835, 836, 837, and 838 are rectangular waves with a duty ratio of 25%, with their phases shifted by 90 degrees. There is a 45-degree phase difference between the reference phase of the rectangular wave group with a duty ratio of 50% and the reference phase of the rectangular wave group with a duty ratio of 25%.

Here, control signals 831, 832, 833, 834, 835, 836, 837, and 838 should preferably have the same frequency, and be synchronized.

Also, it is desirable for control signal 831 and control signal 832, control signal 833 and control signal 834, control signal 835 and control signal 836, and control signal 837 and control signal 838, to be controlled so that mixers driven by the respective control signals are not activated simultaneously. For example, it is desirable for shaping to be performed so that an actual control signal waveform is less than 50% when the duty ratio is 50%, and for shaping to be performed so that an actual control signal waveform is less than 25% when the duty ratio is 25%, so that times when control signals go Hi (on-periods) do not overlap. Furthermore, it is desirable for phase adjustment to be performed between a control signal with a duty ratio of 50% and a control signal with a duty ratio of 25% so that error with respect to a pseudo-sine wave does not increase along with control signal waveform shaping.

The operation of harmonic rejection mixer 800 shown in FIG. 13 will now be described. An alternating voltage signal input from input terminal 821 is branched and input to gm element 801, gm element 802, and gm element 803. Here, gm element 801 outputs an alternating current in accordance with gm 801 to mixer 804 and mixer 805.

Mixer 804 is driven by control signal 831, performs frequency conversion processing on an alternating current output from gm element 801 based on the frequency of control signal 831, and outputs a frequency-converted alternating current to output terminal 822 only while activated by control signal 831. Mixer 805 is driven by control signal 832, performs frequency conversion processing on an alternating current output from gm element 801 based on the frequency of control signal 832, and outputs a frequency-converted alternating current to output terminal 823 only while activated by control signal 832.

Also, gm element 802 outputs an alternating current in accordance with gm 802 to mixer 806, mixer 807, mixer 808, and mixer 809. Mixer 806 is driven by control signal 835, performs frequency conversion processing on an alternating current output from gm element 802 based on the frequency of control signal 835, and outputs a frequency-converted alternating current to output terminal 822 only while activated by control signal 835 (during an on-period). Mixer 807 is driven by control signal 836, performs frequency conversion processing on an alternating current output from gm element 802 based on the frequency of control signal 836, and outputs a frequency-converted alternating current to output terminal 823 only while activated by control signal 836. Mixer 808 is driven by control signal 837, performs frequency conversion processing on an alternating current output from gm element 802 based on the frequency of control signal 837, and outputs a frequency-converted alternating current to output terminal 824 only while activated by control signal 837. Mixer 809 is driven by control signal 838, performs frequency conversion processing on an alternating current output from gm element 802 based on the frequency of control signal 838, and outputs a frequency-converted alternating current to output terminal 825 only while activated by control signal 838.

Furthermore, gm element 803 outputs an alternating current in accordance with gm 803 to mixer 810 and mixer 811. Mixer 810 is driven by control signal 833, performs frequency conversion processing on an alternating current output from gm element 803 based on the frequency of control signal 833, and outputs a frequency-converted alternating current to output terminal 824 only while activated by control signal 833. Mixer 811 is driven by control signal 834, performs frequency conversion processing on an alternating current output from gm element 803 based on the frequency of control signal 834, and outputs a frequency-converted alternating current to output terminal 825 only while activated by control signal 834.

A current resulting from adding the output currents of mixer 804 and mixer 806 flows to output terminal 822 (I positive phase). A current resulting from adding the output currents of mixer 805 and mixer 807 flows to output terminal 823 (I negative phase). A current resulting from adding the output currents of mixer 808 and mixer 810 flows to output terminal 824 (Q positive phase). A current resulting from adding the output currents of mixer 809 and mixer 811 flows to output terminal 825 (Q negative phase).

Here, by connecting an appropriate load to output terminal 822 and output terminal 823, stepped output signal 423 and output signal 424 such as shown in FIG. 10 can be extracted. Also, by connecting an appropriate load to output terminal 824 and output terminal 825, two stepped voltage waveforms with a 90-degree phase difference with respect to output signal 423 and output signal 424 respectively can be extracted.

That is to say, an I-phase output signal is obtained using gm element 801, gm element 802, mixer 804, mixer 805, mixer 806, and mixer 807, and a Q-phase output signal is obtained using gm element 803, gm element 802, mixer 808, mixer 809, mixer 810, and mixer 811.

By using control signals with a duty ratio of 25% for gm common block 840 in this way, gm element 802 can be shared by an I phase and Q phase.

Also, by taking the difference between an output signal of output terminal 822 and an output signal of output terminal 823 using a differential amplifier or the like (not shown) in a subsequent stage after the load, as described in Embodiment 1, stepped output signal 425 approximating a waveform repeating at one cycle of a sine wave shown in FIG. 10, can be obtained. Similarly, an output signal with a 90-degree phase difference with respect to output signal 425 can be obtained by taking the difference between an output signal of output terminal 824 and an output signal of output terminal 825. In this way, harmonic response can be suppressed while limiting the number of gm elements used.

A capacitative element such as a capacitor, for example, can be used as a load connected to output terminals 822, 823, 824, and 825.

Here, a harmonic rejection mixer described in Non-Patent Literature 1 requires three gm elements, and if an orthogonal demodulator were to be configured using the technology of Non-Patent Literature 1, six gm elements would be necessary. In contrast, according to a configuration of this embodiment, an orthogonal demodulator can be configured using three gm elements, enabling the number of gm elements to be decreased, and the circuit scale to be reduced. Moreover, overall circuit power consumption can be suppressed.

Also, a single-end mixer configuration and a double-balance mixer configuration can be implemented based on this technology.

In this embodiment, a configuration has been described whereby the number of gm elements used in a harmonic rejection mixer is reduced by combining a control signal with a duty ratio of 50% and a control signal with a duty ratio of 25%, but this is not a limitation. If the duty ratio of a control signal with a duty ratio of less than 50% is designated N %, the number of gm elements used in a harmonic rejection mixer can be reduced by making a reference phase difference between a control signal with a duty ratio of 50% and a control signal with a duty ratio of N % (180×N/100) degrees, and setting the ratio between the gm of a gm element of a preceding stage of a mixer driven at a duty ratio of 50% and the gm of a gm element of a rear stage of a mixer driven at a duty ratio of N % so that a sine wave can be simulated by a rectangular wave.

Embodiment 4

In this embodiment, an orthogonal demodulator that generates I-phase output and Q-phase output with a 90-degree phase difference is configured using harmonic rejection mixer, with a configuration example different from that in Embodiment 3 being shown. In Embodiment 3, only some of the mixers were driven using a control signal with a duty ratio of less than 50%, whereas this embodiment differs in that all the mixers are driven using control signals with a duty ratio that is a common value of less than 50%. The sharing of gm elements by an I phase and Q phase by utilizing a period in which a mixer is inactive is a point in common with Embodiment 3.

Figure 15:
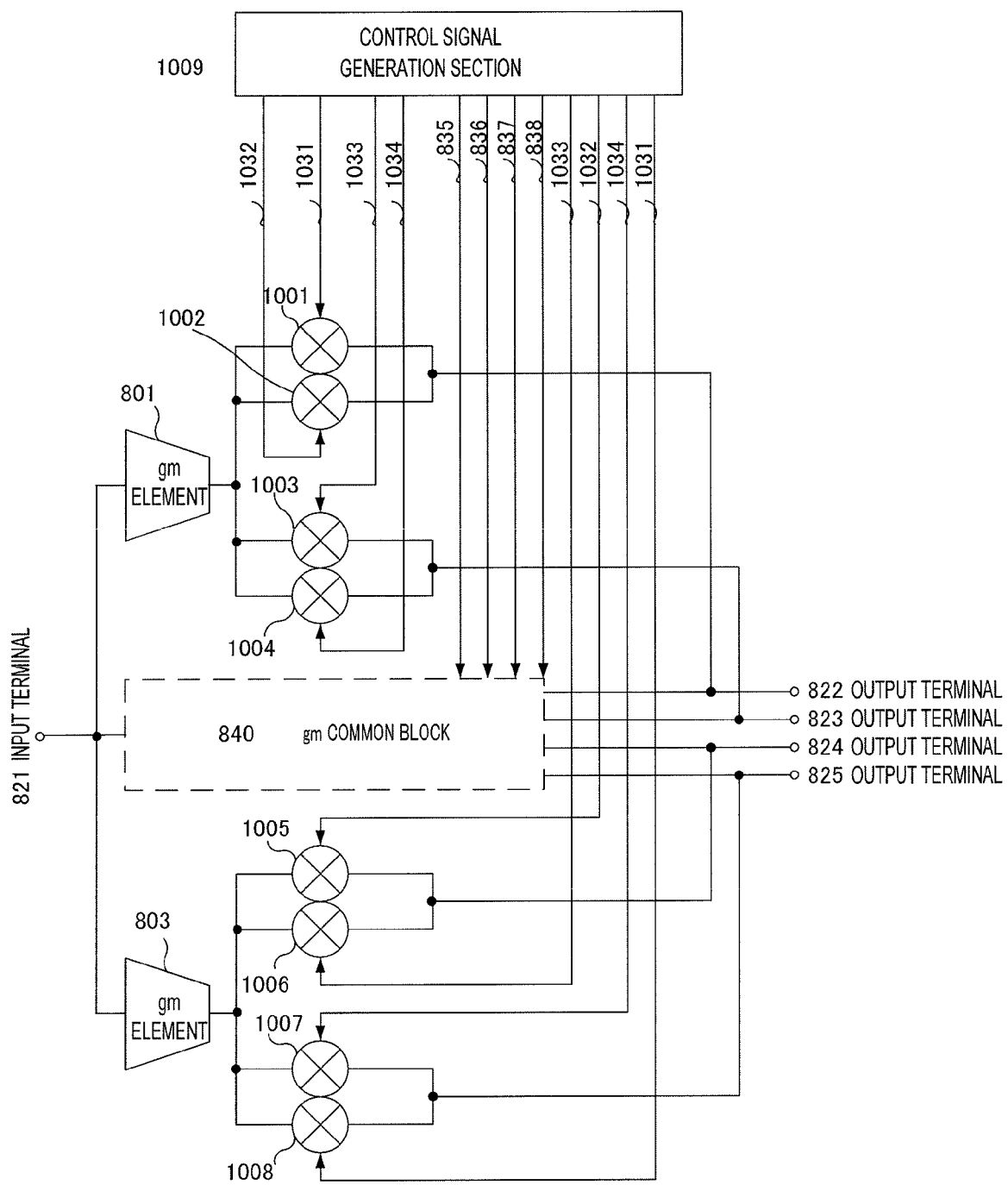
FIG. 15 shows an example of a harmonic rejection mixer according to Embodiment 4.

FIG. 15 is a block diagram showing the general configuration of a harmonic rejection mixer according to this embodiment. As shown in FIG. 15, harmonic rejection mixer 1000 is provided with: I-phase gm element 801; Q-phase gm element 803; gm common block 840 comprising shared gm element 802, mixer 806, mixer 807, mixer 808, and mixer 809; mixer 1001, mixer 1002, mixer 1003, mixer 1004, mixer 1005, mixer 1006, mixer 1007, and mixer 1008; and control signal generation section 1009; and performs frequency conversion of a signal input from input terminal 821, and outputs an I-phase positive-phase signal from output terminal 822, an I-phase negative-phase signal from output terminal 823, a Q-phase positive-phase signal from output terminal 824, and a Q-phase negative-phase signal from output terminal 825. Configuration elements identical to those described using FIG. 13 in Embodiment 3 are assigned the same numbers as in FIG. 13, and descriptions thereof are omitted here.

Above gm element 801, gm element 802, and gm element 803 convert an alternating voltage input from input terminal 821 to an alternating current. Here, the ratios of an input voltage to output current of gm element 801, gm element 802, and gm element 803 are designated gm 801, gm 802, and gm 803, and are set to gm 801:gm 802:gm 803=1:√2:1.

Mixer 1001 is connected to gm element 801, and is driven by control signal 1031 output from control signal generation section 1009. Mixer 1002 is connected to gm element 801, and is driven by control signal 1032 output from control signal generation section 1009. Mixer 1003 is connected to gm element 801, and is driven by control signal 1033 output from control signal generation section 1009. Mixer 1004 is connected to gm element 801, and is driven by control signal 1034 output from control signal generation section 1009.

Also, mixer 1005 is connected to gm element 803, and is driven by control signal 1032 output from control signal generation section 1009. Mixer 1006 is connected to gm element 803, and is driven by control signal 1033 output from control signal generation section 1009. Mixer 1007 is connected to gm element 803, and is driven by control signal 1034 output from control signal generation section 1009. Mixer 1008 is connected to gm element 803, and is driven by control signal 1031 output from control signal generation section 1009.

Here, mixer 1001, mixer 1002, mixer 1003, mixer 1004, mixer 1005, mixer 1006, mixer 1007, and mixer 1008 are preferably passive mixers comprising the NMOS switch shown in FIG. 7A, the PMOS switch shown in FIG. 7B, or the CMOS switch using PMOS and NMOS in a complementary fashion shown in FIG. 7C. The mixers are driven by a control signal, and output an alternating current output from gm element 801, gm element 802, or gm element 803 to output terminal 822, output terminal 823, output terminal 824, or output terminal 825 only while in an active state (during an on-period).

Figure 16:
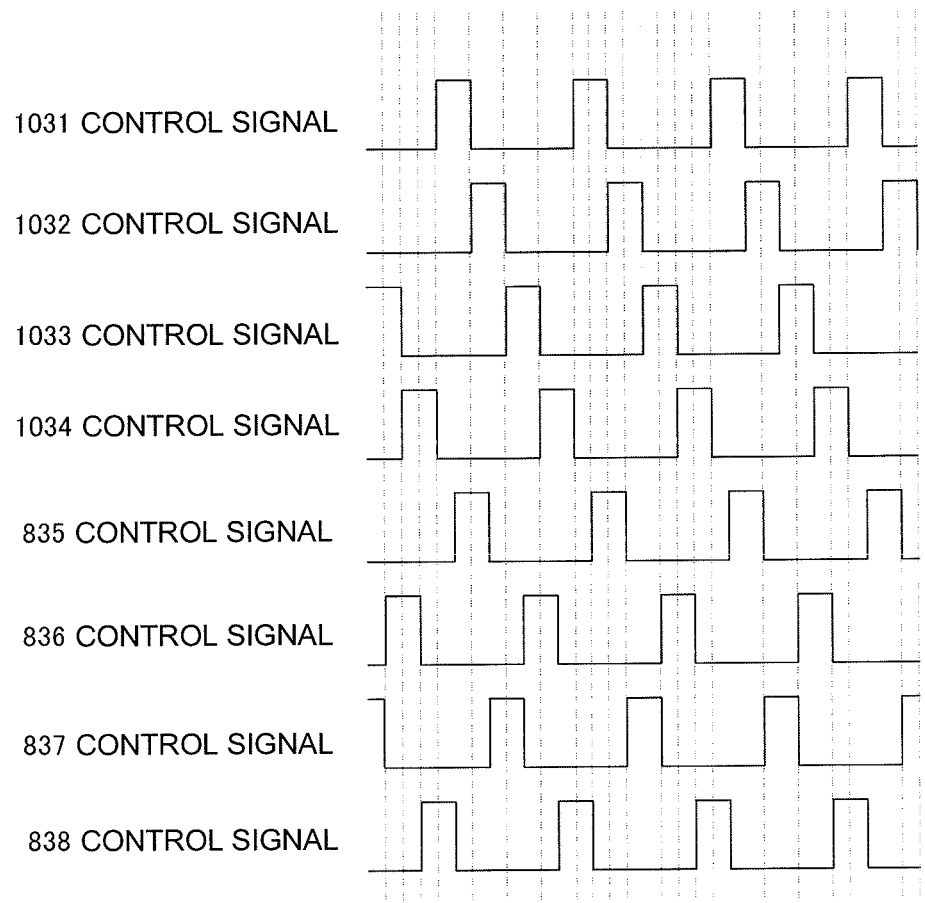
FIG. 16 shows control signal waveforms according to Embodiment 4.

FIG. 16 shows time waveforms of control signals 1031, 1032, 1033, 1034, 835, 836, 837, and 838. These control signals have the same frequency and a common duty ratio, and only their phases differ.

Control signals 835, 836, 837, and 838 input to gm common block 840 are identical to those described using FIG. 14 in Embodiment 3, and descriptions thereof are omitted here. Control signals 1031, 1032, 1033, and 1034 are rectangular waves with a duty ratio of 25%, and with their phases shifted by 90 degrees.

There is a 45-degree phase difference between the reference phase of control signals 1031, 1032, 1033, and 1034, and the reference phase of control signals 835, 836, 837, and 838.

Here, control signals 1031, 1032, 1033, 1034, 835, 836, 837, and 838 should preferably have the same frequency, and be synchronized.

Also, it is desirable for control signal 835, control signal 836, control signal 837, and control signal 838 to be controlled so that mixers driven by the respective control signals are not activated simultaneously.

The operation of harmonic rejection mixer 1000 shown in FIG. 15 will now be described. An alternating voltage signal input from input terminal 821 is branched and input to gm element 801, gm element 802, and gm element 803.

I-phase gm element 801 outputs an alternating current in accordance with gm 801 to mixer 1001, mixer 1002, mixer 1003, and mixer 1004.

Mixer 1001 is driven by control signal 1031, performs frequency conversion processing on an alternating current output from gm element 801 based on the frequency of control signal 1031, and outputs a frequency-converted alternating current to output terminal 822 only while activated by control signal 1031. Mixer 1002 is driven by control signal 1032, performs frequency conversion processing on an alternating current output from gm element 801 based on the frequency of control signal 1032, and outputs a frequency-converted alternating current to output terminal 822 only while activated by control signal 1032.

Mixer 1003 is driven by control signal 1033, performs frequency conversion processing on an alternating current output from gm element 801 based on the frequency of control signal 1033, and outputs a frequency-converted alternating current to output terminal 823 only while activated by control signal 1033. Mixer 1004 is driven by control signal 1034, performs frequency conversion processing on an alternating current output from gm element 801 based on the frequency of control signal 1034, and outputs a frequency-converted alternating current to output terminal 823 only while activated by control signal 1034.

Q-phase gm element 803 outputs an alternating current in accordance with gm 803 to mixer 1005, mixer 1006, mixer 1007, and mixer 1008.

Mixer 1005 is driven by control signal 1032, performs frequency conversion processing on an alternating current output from gm element 803 based on the frequency of control signal 1032, and outputs a frequency-converted alternating current to output terminal 824 only while activated by control signal 1032. Mixer 1006 is driven by control signal 1033, performs frequency conversion processing on an alternating current output from gm element 803 based on the frequency of control signal 1033, and outputs a frequency-converted alternating current to output terminal 824 only while activated by control signal 1033.

Mixer 1007 is driven by control signal 1034, performs frequency conversion processing on an alternating current output from gm element 803 based on the frequency of control signal 1034, and outputs a frequency-converted alternating current to output terminal 825 only while activated by control signal 1034. Mixer 1008 is driven by control signal 1031, performs frequency conversion processing on an alternating current output from gm element 803 based on the frequency of control signal 1031, and outputs a frequency-converted alternating current to output terminal 825 only while activated by control signal 1031.

A current resulting from adding the output currents of mixer 806, mixer 1001, and mixer 1002 flows to output terminal 822 (I positive phase). A current resulting from adding the output currents of mixer 807, mixer 1003, and mixer 1004 flows to output terminal 823 (I negative phase). A current resulting from adding the output currents of mixer 808, mixer 1005, and mixer 1006 flows to output terminal 824 (Q positive phase). A current resulting from adding the output currents of mixer 809, mixer 1007, and mixer 1008 flows to output terminal 825 (Q negative phase).

Here, by connecting an appropriate load to output terminal 822 and output terminal 823, stepped output signal 423 and output signal 424 such as shown in FIG. 10 can be extracted. Also, by connecting an appropriate load to output terminal 824 and output terminal 825, stepped voltage waveforms with a 90-degree phase difference with respect to output signal 423 and output signal 424 can be extracted.

That is to say, an I-phase output signal is obtained using gm element 801, gm element 802, mixer 806, mixer 807, mixer 1001, mixer 1002, mixer 1003, and mixer 1004, and a Q-phase output signal is obtained using gm element 803, gm element 802, mixer 808, mixer 809, mixer 1005, mixer 1006, mixer 1007, and mixer 1008.

By using control signals with a duty ratio of 25% in this way, gm element 802 can be shared by an I phase and Q phase. Also, according to a configuration of this embodiment, all the mixers can be driven by only control signals with a duty ratio of 25%, enabling self-mixing—which is a problem with a direct conversion configuration or Low-IF configuration—to be avoided.

Also, by taking the difference between an output signal of output terminal 822 and an output signal of output terminal 823 using a differential amplifier or the like (not shown) in a subsequent stage after the load, as described in Embodiment 1, stepped output signal 425 approximating a waveform repeating at one cycle of a sine wave shown in FIG. 10, can be obtained. Similarly, an output signal with a 90-degree phase difference with respect to output signal 425 can be obtained by taking the difference between an output signal of output terminal 824 and an output signal of output terminal 825. In this way, harmonic response can be suppressed while limiting the number of gm elements used.

A capacitive element such as a capacitor, for example, can be used as a load connected to output terminals 822, 823, 824, and 825.

Here, a harmonic rejection mixer described in Non-Patent Literature 1 requires three gm elements, and if an orthogonal demodulator were to be configured using the technology of Non-Patent Literature 1, six gm elements would be necessary. In contrast, according to a configuration of this embodiment, an orthogonal demodulator can be configured using three gm elements, enabling the number of gm elements to be decreased, and the circuit scale to be reduced. Moreover, overall circuit power consumption can be suppressed. In addition, since all the mixers are driven using only control signals whose duty ratio is a common value, a configuration of this embodiment also has an effect of enabling self-mixing—which is a problem with a direct conversion configuration or Low-IF configuration—to be avoided.

Also, a single-end mixer configuration and a double-balance mixer configuration can be implemented based on this technology. In this embodiment, a configuration example has been described in which only control signals with a duty ratio of 25% are used, but this is not a limitation as long as the control signal duty ratio is less than 50%, and some of the gm elements can be shared by an I phase and Q phase.

Embodiment 5

In this embodiment, a configuration is shown that implements a direct sampling mixer using a harmonic rejection mixer shown in Embodiment 1 through Embodiment 4.

Figure 17:
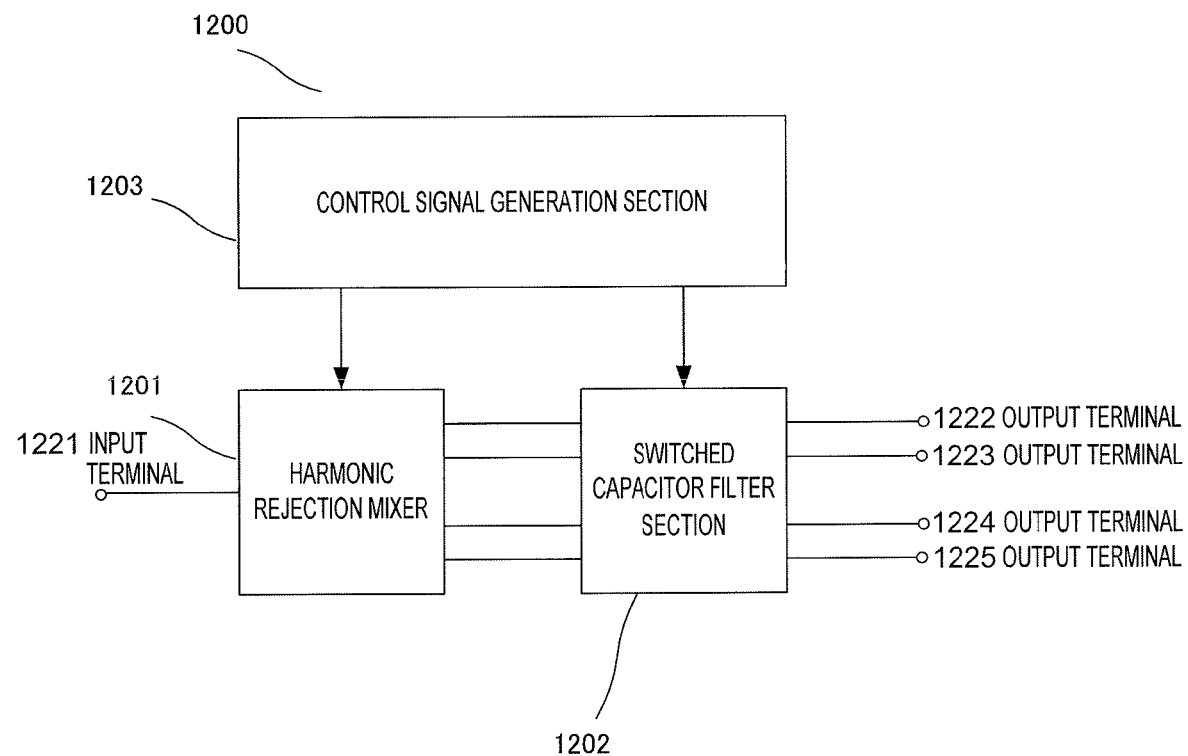
FIG. 17 shows an example of a direct sampling mixer according to Embodiment 5.

FIG. 17 shows an example of a direct sampling mixer according to Embodiment 5 of the present invention. As shown in FIG. 17, direct sampling mixer 1200 is provided with harmonic rejection mixer 1201, switched capacitor filter section 1202, and control signal generation section 1203, performs frequency conversion of a signal input from input terminal 1221, and outputs an I-phase positive-phase signal from output terminal 1222, an I-phase negative-phase signal from output terminal 1223, a Q-phase positive-phase signal from output terminal 1224, and a Q-phase negative-phase signal from output terminal 1225.

Harmonic rejection mixer 1201 is configured as an orthogonal demodulator using a harmonic rejection mixer shown in Embodiment 1 or Embodiment 2, or a harmonic rejection mixer with an orthogonal demodulator configuration shown in Embodiment 3 or Embodiment 4.

Switched capacitor filter section 1202 is a filter comprising an MOS switch and capacitance that performs I-phase and Q-phase processing using a sampling circuit shown in Patent Literature 7, for example.

Control signal generation section 1203 comprises a digital control unit that generates a control signal for controlling a mixer included in harmonic rejection mixer 1201 in order to drive harmonic rejection mixer 1201, and a control signal for driving switched capacitor filter section 1202. A configuration shown in Patent Literature 7, for example, can be used as a digital control unit that generates a control signal for driving switched capacitor filter section 1202.

By using this configuration, a direct sampling mixer can be implemented using a harmonic rejection mixer shown in Embodiment 1 through Embodiment 4.

In Embodiment 1 through Embodiment 4, the description has assumed that a mixer is placed in an active state while a control signal is Hi (in the high period of a rectangular pulse), but if a PMOS configuration or a CMOS configuration with PMOS and NMOS utilized in a complementary fashion is used for a mixer, it goes without saying that a mixer using PMOS can be placed in an active state by reading "Hi period" as "Low period" (the low period of a rectangular pulse) in the description. In any case, a period during which a mixer is in an active state can be referred to as an on-period, and a period during which a mixer is in an inactive state can be referred to as an off-period.

The above description presents examples of preferred embodiments of the present invention, but the scope of the present invention is not limited to these. For example, if a control signal generation section is implemented by means of a semiconductor element, there is a possibility of the ratio of an on-period to one cycle in a driving signal deviating by several % from 50% or 25%. In this case, the waveform shape of a harmonic rejection mixer output signal will fluctuate. However, if the deviation of the ratio of an on-period to one cycle from 50% or 25% is not great, but only several %, a stepped output signal approximating a waveform repeating at one cycle (or a half cycle) of a sine wave can be obtained from a harmonic rejection mixer. Therefore, if the ratio of an on-period to one cycle in a driving signal deviates by several % from 50% or 25%, the effect of the present invention can still be obtained, although the harmonic response suppression effect will decrease slightly compared with a case in which the ratio of an on-period to one cycle is 50% or 25%. In the course of development, the present inventors confirmed that, when a control signal generation section is implemented by means of a semiconductor element, the effect of the present invention can be obtained even when semiconductor element variation is taken into consideration.

The disclosure of Japanese Patent Application No. 2009-017898, filed on Jan. 29, 2009, including the specification, drawings and abstract, is incorporated herein by reference in its entirety.

INDUSTRIAL APPLICABILITY

A harmonic rejection mixer of the present invention enables a harmonic rejection mixer to be implemented that makes it possible to suppress harmonic response while suppressing an increase in the number of gm elements, and is suitable for use in an odd-order harmonic response suppression (harmonic rejection) technology for a mixer used in a high frequency processing section in a radio communication system or the like.

REFERENCE SIGNS LIST 1, 2, 3 gm element
4, 5, 6 Mixer
10 Harmonic rejection mixer
11 Input terminal
12 Output terminal
21, 22, 23 Control signal
50 Power amplifier
51, 52 Amplifier circuit
55, 56, 57 Input signal
61, 62, 63 Input terminal
64 Output terminal
100 Harmonic rejection mixer
101, 102 gm element
103, 104 Mixer
105 Control signal generation section
111 Input terminal
112 Output terminal
121, 122 Control signal
123 Output signal
400 Harmonic rejection mixer
401, 402 gm element
403, 404, 405, 406 Mixer
407 Control signal generation section
411 Input terminal
412, 413 Output terminal
421, 422 Control signal
423, 424, 425 Output signal
600 Harmonic rejection mixer
601, 602 gm element
603, 604, 605, 606, 607, 608, 609, 610 Mixer
611 Input terminal
612 Output terminal
621, 622 Output signal
800 Harmonic rejection mixer
801, 802, 803 gm element
804, 805, 806, 807, 808, 809, 810, 811 Mixer
812 Control signal generation section
821 Input terminal
822, 823, 824, 825 Output terminal
831, 832, 833, 834, 835, 836, 837, 838 Control signal
1000 Harmonic rejection mixer
1001, 1002, 1003, 1004, 1005, 1006, 1007, 1008 Mixer
1009 Control signal generation section
1031, 1032, 1033, 1034 Control signal
1200 Direct sampling mixer
1201 Harmonic rejection mixer
1202 Switched capacitor filter section
1203 Control signal generation section
1221 Input terminal
1222, 1223, 1224, 1225 Output terminal

The invention claimed is:

1. A harmonic rejection mixer that adjusts a waveform of an output signal by combining outputs of a plurality of mixers connected in parallel to a rear stage of a plurality of gm elements, the harmonic rejection mixer comprising, as the plurality of gm elements that convert a voltage signal to a current signal, an I-phase gm element, a Q-phase gm element, and a shared gm element shared by an I phase and Q phase, wherein:
each output of the plurality of gm elements branches into a plurality; each of the plurality of mixers has a configuration in which a switching element is connected to a branch of one output among the plurality of gm elements;
a switching element connected to a branch of an output of the I-phase gm element and the Q-phase gm element is controlled by a driving signal with a ratio of an on-period to one cycle of 50%;
a switching element connected to a branch of an output of the shared gm element is controlled by a driving signal with a ratio of an on-period to one cycle of less than 50%; and
a Q-phase output switching element is on in at least part of an off-period of an I-phase output switching element among a plurality of the switching elements connected to the shared gm element.

2. The harmonic rejection mixer according to claim 1, wherein, in any of the plurality of gm elements, the switching elements connected to each branch of an output of a same gm element are controlled by driving signals comprising pulse trains that prevent entry into an on state simultaneously.

3. The harmonic rejection mixer according to claim 1, wherein a switching element connected to a branch of an output of the shared gm element is controlled by a driving signal with a ratio of an on-period to one cycle of 25%.

4. The harmonic rejection mixer according to claim 1, wherein a driving signal group that controls the switching elements comprises pulse trains of a same frequency having mutually different phases.

5. The harmonic rejection mixer according to claim 1, wherein the plurality of gm elements perform amplitude weighting on an input signal.

6. A harmonic rejection mixer that adjusts a waveform of an output signal by combining outputs of a plurality of mixers connected in parallel to a rear stage of a plurality of gm elements, the harmonic rejection mixer comprising, as the plurality of gm elements that convert a voltage signal to a current signal, an I-phase gm element, a Q-phase gm element, and a shared gm element shared by an I phase and Q phase, wherein:
each output of the plurality of gm elements branches into a plurality;
each of the plurality of mixers has a configuration in which a switching element is connected to a branch of one output among the plurality of gm elements;
a switching element connected to a branch of each output of the I-phase gm element, the Q-phase gm element, and the shared gm element is controlled by a driving signal with a ratio of an on-period to one cycle that is a common value of less than 50%; and
a Q-phase output switching element is on in at least part of an off-period of an I-phase output switching element among a plurality of the switching elements connected to the shared gm element.

7. The harmonic rejection mixer according to claim 6, further comprising a plurality of capacitors connected to a rear stage of the plurality of mixers, wherein, in any of the plurality of gm elements, of the switching elements connected to each branch of an output of a same gm element, switching elements connected to different capacitors are controlled by driving signals comprising pulse trains that prevent entry into an on state simultaneously.

8. The harmonic rejection mixer according to claim 6, wherein the switching element connected to a branch of each output of the I-phase gm element, the Q-phase gm element, and the shared gm element is controlled by a driving signal with a ratio of an on-period to one cycle of 25%.

9. The harmonic rejection mixer according to claim 6, wherein a driving signal group that controls the switching elements comprises pulse trains of a same frequency having mutually different phases.

10. The harmonic rejection mixer according to claim 6, wherein the plurality of gm elements perform amplitude weighting on an input signal.

* * * * *